(12) United States Patent
Liu et al.

(10) Patent No.: US 10,644,043 B2
(45) Date of Patent: May 5, 2020

(54) POLY-SILICON THIN FILM AND METHOD FOR FABRICATING THE SAME, AND THIN FILM TRANSISTOR AND METHOD FOR FABRICATING THE SAME

(71) Applicants: BOE Technology Group Co., Ltd., Beijing (CN); Hefei Xinsheng Optoelectronics Technology Co., Ltd., Hefei, Anhui (CN)

(72) Inventors: Jun Liu, Beijing (CN); Tongshang Su, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/090,752

(22) PCT Filed: Feb. 13, 2018

(86) PCT No.: PCT/CN2018/076760
§ 371 (c)(1),
(2) Date: Oct. 2, 2018

(87) PCT Pub. No.: WO2018/171368
PCT Pub. Date: Sep. 27, 2018

(65) Prior Publication Data
US 2019/0096926 A1 Mar. 28, 2019

(30) Foreign Application Priority Data
Mar. 22, 2017 (CN) .......................... 2017 1 0172988

(51) Int. Cl.
*H01L 27/12* (2006.01)
*H01L 21/02* (2006.01)
(Continued)

(52) U.S. Cl.
CPC .... *H01L 27/1277* (2013.01); *H01L 21/02422* (2013.01); *H01L 21/02491* (2013.01);
(Continued)

(58) Field of Classification Search
CPC ............. H01L 27/1277; H01L 27/1222; H01L 21/02491; H01L 21/02502;
(Continued)

(56) References Cited

U.S. PATENT DOCUMENTS

2009/0050893 A1* 2/2009 Park ..................... H01L 29/458
257/72
2018/0040717 A1* 2/2018 Li ..................... H01L 21/02068

FOREIGN PATENT DOCUMENTS

CN 200410010970.6 8/2007
CN 101373793 A 2/2009
(Continued)

OTHER PUBLICATIONS

Chinese Office Action for counterpart CN 201710172988.3 dated Mar. 18, 2019.
(Continued)

*Primary Examiner* — Tong-Ho Kim
(74) *Attorney, Agent, or Firm* — Arent Fox LLP; Michael Fainberg

(57) ABSTRACT

Embodiments of this disclosure provide a thin film of poly-silicon and a method for fabricating the same, and a thin film transistor and a method for fabricating the same, where a metal layer, a buffer layer, and an amorphous-silicon layer are formed on an underlying substrate successively, and metal atoms of the metal layer can be diffused to come into contact with the amorphous-silicon layer, so that the amorphous-silicon can be converted into a poly-silicon layer under the catalysis of the metal ions.

15 Claims, 3 Drawing Sheets

(51) Int. Cl.
*H01L 21/225* (2006.01)
*H01L 21/324* (2006.01)
*H01L 21/3065* (2006.01)
*H01L 29/786* (2006.01)
*H01L 29/66* (2006.01)
*H01L 21/3213* (2006.01)

(52) U.S. Cl.
CPC .. *H01L 21/02502* (2013.01); *H01L 21/02505* (2013.01); *H01L 21/02532* (2013.01); *H01L 21/02672* (2013.01); *H01L 21/2251* (2013.01); *H01L 21/3065* (2013.01); *H01L 21/324* (2013.01); *H01L 21/32137* (2013.01); *H01L 27/1222* (2013.01); *H01L 29/66757* (2013.01); *H01L 29/78675* (2013.01); *H01L 21/02592* (2013.01)

(58) Field of Classification Search
CPC ......... H01L 21/02532; H01L 21/02672; H01L 21/2251; H01L 21/3065; H01L 21/324; H01L 21/02592; H01L 29/78675

USPC ......................................................... 257/72
See application file for complete search history.

(56) References Cited

FOREIGN PATENT DOCUMENTS

| | | |
|---|---|---|
| CN | 101740359 A | 6/2010 |
| CN | 104299891 A | 1/2015 |
| CN | 105470312 A | 4/2016 |
| CN | 106876478 A | 6/2017 |
| JP | 2001093853 A | 4/2001 |
| KR | 100685855 B1 | 2/2007 |

OTHER PUBLICATIONS

International Search Report for PCT/CN2018/076760 dated Apr. 4, 2018.

* cited by examiner

POLY-SILICON THIN FILM AND METHOD FOR FABRICATING THE SAME, AND THIN FILM TRANSISTOR AND METHOD FOR FABRICATING THE SAME

This application is a National Stage of International Application No. PCT/CN2018/076760, filed Feb. 13, 2018, which claims the benefit of Chinese Patent Application No. 201710172988.3, filed with the Chinese Patent Office on Mar. 22, 2017, and entitled "A poly-silicon thin film and a method for fabricating the same, and a thin film transistor and a method for fabricating the same", both of which are hereby incorporated by reference in their entireties.

FIELD

This disclosure relates to the field of display technologies, and particularly to a poly-silicon thin film and a method for fabricating the same, and a thin film transistor and a method for fabricating the same.

BACKGROUND

Poly-silicon has been widely favored in the industry of fabricating a thin film transistor, and particularly in an application of a thin film transistor-driven display due to its better electrical characteristic than amorphous silicon, and lower cost than mono-crystal silicon.

SUMMARY

An embodiment of this disclosure provides a method for fabricating a thin film of poly-silicon applicable to a thin film transistor, the fabricating method includes:

forming a metal layer on one side of an underlying substrate;

forming a buffer layer on a side of the metal layer away from the underlying substrate;

forming an amorphous-silicon layer on a side of the buffer layer away from the underlying substrate; and converting the amorphous-silicon layer into a poly-silicon layer by catalyzing the amorphous-silicon layer using metal ions which are metal ions diffused from the metal layer, and coming into contact with the amorphous-silicon layer.

In some possible implementation, in the fabricating method according to embodiments of this disclosure, after the buffer layer is formed, and before the amorphous-silicon layer is formed on the buffer layer, the method further includes:

forming a metal diffusion layer on the side of the buffer layer way from the underlying substrate in a first annealing process, wherein the metal diffusion layer is formed by diffusing the metal atoms of the metal layer into the side of the buffer layer away from the underlying substrate; and the converting the amorphous-silicon layer into the poly-silicon layer by catalyzing the amorphous-silicon layer using the metal ions includes:

converting the amorphous-silicon layer into the poly-silicon layer under a catalysis of the metal diffusion layer in a second annealing process.

In some possible implementation, in the fabricating method according to embodiments of this disclosure, the forming the amorphous-silicon layer includes:

forming a thin film of poly-silicon on a side of the metal diffusion layer away from the underlying substrate; and etching the thin film of poly-silicon in a dry etching process to form a patterned amorphous-silicon layer, and removing the metal diffusion layer in other areas than a first area, wherein a orthographic projection of the first area onto the underlying substrate overlaps with a orthographic projection of the pattern of the amorphous-silicon layer onto the underlying substrate.

In some possible implementation, in the fabricating method according to embodiments of this disclosure, the forming the metal layer includes:

forming a patterned metal layer on the one side of the underlying substrate, where a orthographic projection of the pattern of the metal layer onto the underlying substrate overlaps with a orthographic projection of the pattern of the amorphous-silicon layer onto the underlying substrate.

In some possible implementation, in the fabricating method according to embodiments of this disclosure, the converting the amorphous-silicon layer into the poly-silicon layer by catalyzing the amorphous-silicon layer using the metal ions includes:

diffusing the metal atoms of the metal layer into the amorphous-silicon layer in a third annealing process, and converting the amorphous-silicon layer into the poly-silicon layer under the catalysis of the diffused metal ions.

In some possible implementation, in the fabricating method according to embodiments of this disclosure, after the converting the amorphous-silicon layer into the poly-silicon layer, the fabricating method further includes:

processing a surface of the poly-silicon layer away from the buffer layer, and removing a part of the poly-silicon layer on the surface away from the buffer layer.

In some possible implementation, in the fabricating method according to embodiments of this disclosure, before the forming the metal layer, the fabricating method further includes:

forming a barrier layer on the underlying substrate.

Correspondingly, an embodiment of this disclosure further provides a method for fabricating a thin film transistor, the method includes:

forming a patterned thin film of poly-silicon on an underlying substrate using the method for fabricating a thin film of poly-silicon according to any one of embodiments above of this disclosure;

forming a gate insulation layer and a patterned gate on a side of the poly-silicon layer away from the underlying substrate successively, wherein a orthographic projection of the pattern of the poly-silicon layer onto the underlying substrate covers a orthographic projection of the pattern of the gate onto the underlying substrate;

forming a source-drain insulation layer with a first through-hole and a second through-hole on the side of the gate away from the underlying substrate, wherein the orthographic projection of the pattern of the poly-silicon layer onto the underlying substrate covers orthographic projections of the first through-hole and the second through-hole onto the underlying substrate; and the orthographic projections of the first through-hole and the second through-hole onto the underlying substrate do not overlap with the orthographic projection of the pattern of the gate onto the underlying substrate; and forming a source and a drain on the side of the source-drain insulation layer away from the underlying substrate, wherein the source is connected with the poly-silicon layer through the first through-hole, and the drain is connected in contact with the poly-silicon layer through the second through-hole.

Correspondingly, an embodiment of this disclosure further provides a thin film of poly-silicon including:

a metal layer arranged on one side of an underlying substrate;

a buffer layer arranged on the side of the metal layer away from the underlying substrate; and a poly-silicon layer arranged on the side of the buffer layer away from the underlying substrate, wherein the poly-silicon layer is fabricated using the method above for fabricating a thin film of poly-silicon according to any one of the embodiments above of this disclosure.

Correspondingly, an embodiment of this disclosure further provides a thin film transistor including:

a thin film of poly-silicon arranged on one side of an underlying substrate, wherein the thin film of poly-silicon is the thin film of poly-silicon according to the embodiment above of this disclosure;

a gate insulation layer and a patterned gate arranged on the side of the thin film of poly-silicon away from the underlying substrate successively, wherein a orthographic projection of the pattern of the poly-silicon layer onto the underlying substrate covers a orthographic projection of the pattern of the gate onto the underlying substrate;

a source-drain insulation layer arranged on the side of the gate away from the underlying substrate, and with a first through-hole and a second through-hole, wherein the orthographic projection of the pattern of the poly-silicon layer onto the underlying substrate covers orthographic projections of the first through-hole and the second through-hole onto the underling substrate, and the orthographic projections of the first through-hole and the second through-hole onto the underling substrate do not overlap with the orthographic projection of the pattern of the gate onto the underlying substrate; and a source and a drain arranged on the side of the source-drain insulation layer away from the underlying substrate, wherein the source is connected with the poly-silicon layer through the first through-hole, and the drain is connected with the poly-silicon layer through the second through-hole.

DETAILED DESCRIPTION OF THE EMBODIMENTS

Figure 1:
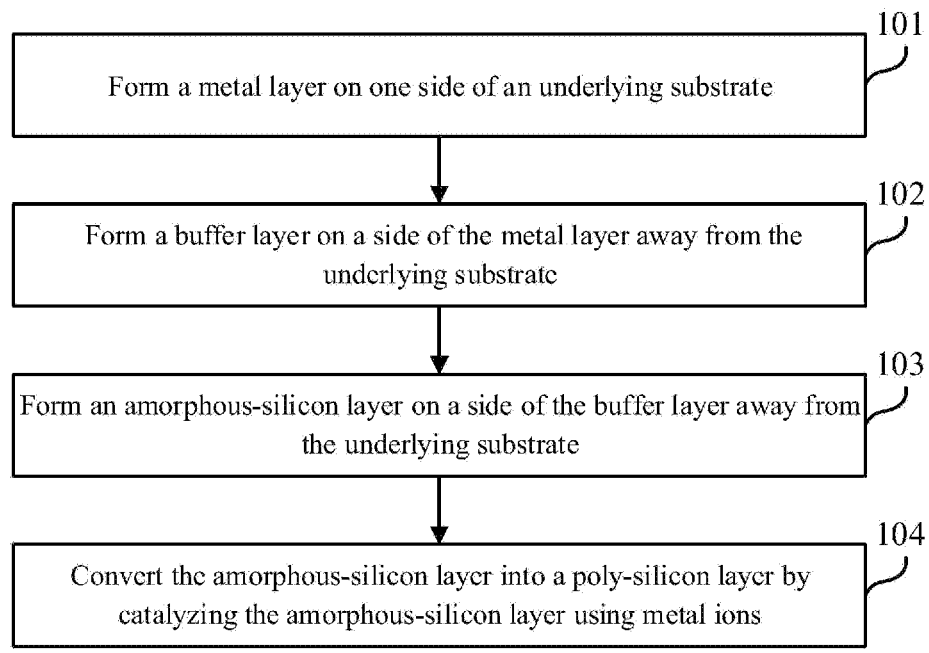
FIG. 1 is a flow chart of a method for fabricating a thin film of poly-silicon according to an embodiment of this disclosure.

The material of an active layer for fabricating a thin film transistor is generally silicon, e.g., amorphous-silicon, poly-silicon, micro-crystal silicon, etc. Poly-silicon has been widely favored in the industry of fabricating a thin film transistor due to its better electrical characteristic than amorphous-silicon, and lower cost than mono-crystal silicon. At present, a high-performance thin film of poly-silicon can be fabricated in a low-temperature process using the Metal Induced Crystallization (MIC) technology with a significant advantage over the other low-temperature poly-silicon technologies. Typically in a method for fabricating a thin film of poly-silicon using the MIC technology, firstly a thin film of amorphous-silicon is fabricated, then a metal isolation layer and a metal layer are deposited on the thin film of amorphous-silicon successively so that metal atoms of the metal layer can be diffused into the thin film of amorphous-silicon through the metal isolation layer, and thereafter the thin film of amorphous-silicon including the metal atoms is annealed in an annealing process so that the thin film of amorphous-silicon including the metal atoms is converted into the thin film of poly-silicon in the annealing process. Here the thin film of amorphous-silicon is generally converted into the thin film of poly-silicon using the metal atoms of the metal layer as a catalyzer so that the amorphous-silicon layer is converted into the poly-silicon layer under the catalysis of the metal atoms. Since the metal isolation layer is further formed between the metal layer and the amorphous-silicon layer, in order to enable the metal atoms of the metal layer to catalyze the amorphous-silicon layer, the metal layer shall be heated to some extent so that the metal atoms of the metal layer can be diffused, and thus the diffused metal atoms can come into contact with the amorphous-silicon layer.

However in the fabrication process using the MIC technology, the thin film of amorphous-silicon shall be converted into the thin film of poly-silicon by fabricating the metal isolation layer separately, and the metal isolation layer and the metal layer shall be further removed after the thin film of amorphous-silicon is converted into the thin film of poly-silicon, so that there are a high cost and a complex process of fabricating the thin film of poly-silicon from the thin film of amorphous-silicon using the existing MIC technology.

For this, embodiments of this disclosure provide a method for fabricating a thin film of poly-silicon applicable to a thin film transistor. With this method, the metal isolation layer may not be fabricated separately, and processes of removing the metal layer and the buffer layer can be further dispensed with to thereby lower a production cost and reduce the number of steps in the fabrication process.

Implementations of the embodiments of this disclosure will be described below in details with reference to the drawings. It shall be noted that like or similar reference numerals throughout the specification refer to like or similar elements, or elements with like or similar functions. The embodiments to be described with reference to the drawings are illustrative, and only intended to illustrate this disclosure, but not to limit the disclosure thereto. The embodiments of this disclosure, and the features in the embodiments can be combined with each other unless they conflict with each other.

Referring to FIG. 1, a method for fabricating a thin film of poly-silicon applicable to a thin film transistor according to an embodiment of this disclosure can include the following steps.

The step 101 is to form a metal layer on one side of an underlying substrate.

In an implementation, the metal layer with a thickness of one to hundreds of nanometers (e.g., 1 nm to 100 nm) can be fabricated on the underlying substrate in a spraying, Plasma Enhanced Chemical Vapor Deposition (PECVD), or another process. Optionally, the thickness of the fabricated metal layer can be 10 nm, 50 nm, or 100 nm. Optionally, the material of the metal layer can include any one of Ni, Au, Cu, Pd, Co, or Ag.

The underlying substrate in the embodiment of this disclosure can optionally be a glass substrate. Of course, the underlying substrate can alternatively be a substrate made of another material, although the embodiment of this disclosure will not be limited thereto.

In order to prevent purity ion in the glass substrate (e.g., alkali metal in the glass, e.g., Na or K ions) from entering and thus affect an overlying layer, optionally before the metal layer is formed on the underlying substrate, the fabricating method can further include: forming a barrier layer on the underlying substrate. In an implementation, the barrier layer with the thickness of tens to hundreds of nanometers (e.g., 10 nm to 100 nm) is fabricated on the underlying substrate in a PECVD, Low Pressure Chemical Vapor Deposition (LPCVD) or another process. Optionally, the thickness of the fabricated barrier layer can be 10 nm, 50 nm, or 100 nm. In a real application, the material of the barrier layer can include a compound of silicon and nitride, and for example, the material of the barrier layer can include SiNx.

The step 102 is to form a buffer layer on the side of the metal layer away from the underlying substrate.

In an implementation, the buffer layer with the thickness of tens to hundreds of nanometers (e.g., 10 nm to 100 nm) can be fabricated on the metal layer in a PECVD, LPCVD, or another process. Optionally, the thickness of the fabricated buffer layer can be 10 nm, 50 nm, or 100 nm. The buffer layer is typically a common buffer layer in the thin film transistor, and in the embodiment of this disclosure, the buffer layer can act as a common buffer layer in the thin film transistor, but also can control the number of metal atoms of the metal layer being diffused into an underlying thin film of amorphous-silicon, that is, the buffer layer can be arranged between the amorphous-silicon layer and the metal layer to prevent too many metal atoms of the metal layer from being diffused into the amorphous-silicon layer so as to avoid considerate leakage current from occurring due to a large number of metal atoms in the formed thin film transistor. The material of the buffer layer can include a compound of silicon and oxygen, e.g., SiOx.

The step 103 is to form an amorphous-silicon layer on the side of the buffer layer away from the underlying substrate.

In an implementation, the amorphous-silicon layer with a thickness of 10 nm to 100 nm can be deposited on the buffer layer in a PECVD, LPCVD, or another process. Optionally, the thickness of the fabricated amorphous-silicon layer can be 50 nm. It shall be appreciated that a poly-silicon layer into which the amorphous-silicon layer is converted is typically an active layer in the thin film transistor.

The step 104 is to convert the amorphous-silicon layer into a poly-silicon layer by catalyzing the amorphous-silicon layer using metal ions which are metal ions diffused from the metal layer, and coming into contact with the amorphous-silicon layer.

In the method for fabricating a thin film of poly-silicon applicable to a thin film transistor according to the embodiment of this disclosure, after the metal layer, the buffer layer, and the amorphous-silicon layer are formed on the underlying substrate successively, the metal atoms of the metal layer can be diffused and come into contact with the amorphous-silicon layer, and the amorphous-silicon layer can be converted into the poly-silicon layer under the catalysis of the metal atoms. Since the amorphous-silicon layer is converted into the poly-silicon layer using the buffer layer in the fabricated thin film transistor instead of the metal isolation layer in the related art, the metal isolation layer may not be fabricated separately. Since the buffer layer and the metal layer are fabricated before the amorphous-silicon layer is formed, processes of removing the metal layer and the buffer layer can be further dispensed with to thereby lower a production cost and reduce the number of steps in the fabrication process.

It shall be noted that the thin film of amorphous-silicon is generally converted into the thin film of poly-silicon in the metal induced crystallization method using the metal ions as a catalyzer so that the amorphous-silicon layer is converted into the poly-silicon layer under the catalysis of the metal ions, and since the buffer layer is further formed between the metal layer and the amorphous-silicon layer, in order to enable the metal ions of the metal layer to catalyze the amorphous-silicon layer, the metal layer shall be heated to some extent so that the metal atoms of the metal layer can be diffused and come into contact with the amorphous-silicon layer. In an implementation, the amorphous-silicon layer can be converted into the poly-silicon layer in different process steps as described below in details by way of an example.

In order to enable the metal atoms of the metal layer to be diffused sufficiently into the amorphous-silicon layer, and to form the thin film of poly-silicon with excellent crystallization performance, in the fabricating method according to the embodiment of this disclosure, after the buffer layer is formed, and before the amorphous-silicon layer is formed on the buffer layer, the method can further include: forming a metal diffusion layer on the side of the buffer layer way from the underlying substrate in a first annealing process, where the metal diffusion layer is formed by diffusing the metal atoms of the metal layer into the side of the buffer layer away from the underlying substrate. Furthermore, converting the amorphous-silicon layer into the poly-silicon layer by catalyzing the amorphous-silicon layer using the metal ions can include: converting the amorphous-silicon layer into the poly-silicon layer under the catalysis of the metal diffusion layer in a second annealing process. Generally, there are more defects on the surface of a thin film than those in the thin film, and since metal ions are generally diffused into an area with more defects, the metal ions tend to be diffused into the surface of the buffer layer to form the metal diffusion layer. After the metal diffusion layer is formed on the buffer layer in the first annealing process, the amorphous-silicon layer is further formed on the side of the metal diffusion layer away from the underlying substrate, and the amorphous-silicon layer is further converted into the poly-silicon layer under the catalysis of the metal ions of the metal diffusion layer in the second annealing process. Optionally, the first annealing process can be an annealing process performed at temperature below 600 □ for a first preset length of time, and the second annealing process can be an annealing process performed at temperature below 600 □ for a second preset length of time. In a real application, the first preset length of time, and the second preset length of time can be determined as needed in a real application environment, although the embodiment of this disclosure will not be limited thereto.

In some embodiments of this disclosure, the amorphous-silicon layer can alternatively be converted into the poly-silicon layer in one annealing process, that is, after the buffer layer is formed on the metal layer, the amorphous-silicon layer can be formed directly on the buffer layer, the metal ions of the metal layer can be diffused into the amorphous-silicon layer in one annealing process for a longer period of time, i.e., a third annealing process, and the amorphous-silicon layer can be converted into the poly-silicon layer under the catalysis of the metal ions diffused into the amorphous-silicon layer, where the third annealing process can be an annealing process performed at temperature below 600 □ for a third preset length of time. The third preset length of time is more than both the first preset length of time and the second preset length of time, that is, the length of time for the third annealing process is more than those of the first and second annealing processes. In a real application, the third preset length of time can be determined as needed in a real application environment, although the embodiment of this disclosure will not be limited thereto.

In some embodiments of this disclosure, the poly-silicon layer can be fabricated by fabricating the poly-silicon layer as a patterned poly-silicon layer directly, that is, the poly-silicon layer is formed directly to have the pattern of the active layer. For example, the thin film of poly-silicon is formed only in a channel area of the thin film transistor, the amorphous-silicon layer is converted into the poly-silicon layer in the two annealing processes, and if the patterned poly-silicon layer is to be formed, then the thin film of amorphous-silicon may be formed on the side of the metal diffusion layer away from the underlying substrate after the first annealing process is performed; and thereafter the thin film of amorphous-silicon is etched in a dry etching process to form the patterned amorphous-silicon layer, that is, the amorphous-silicon layer is formed directly to have the pattern of the active layer. Optionally, the patterned amorphous-silicon layer can alternatively be formed by selecting an appropriate over-etching ratio, and removing the metal diffusion layer in the other area than a first area, where the first area corresponds to the channel area of the thin film transistor, and the other area than the first area corresponds to another area of the thin film transistor than the channel area. Since the metal ions of the metal layer may be further diffused into an area corresponding to the other area than the channel area while being diffused into the buffer layer, the thin film of amorphous-silicon at the metal diffusion layer in the other area than the first area can be removed while patterning the thin film of amorphous-silicon to thereby alleviate the thin film transistor formed of the thin film of poly-silicon from being affected by the metal ions of the metal layer diffused into the other area than the channel area. Stated otherwise, the thin film transistor formed of the thin film of poly-silicon can be alleviated from being affected by the metal ions of the metal layer diffused into the other area than the channel area without adding any steps to the fabrication process. Here the over-etching ratio can be set that while the amorphous-silicon layer in the other area than the channel area is removed, downward etching can be further performed to remove the metal diffusion layer corresponding to the other area than the channel area below the amorphous-silicon layer. For example, if the amorphous-silicon layer corresponding to the other area than the channel area is etched for 30 minutes and removed, then the period of time for etching may be extended to 40 minutes as appropriate to etch away the metal diffusion layer corresponding to the other area than the channel area. Of course, 30 and 40 minutes have been given above only by way of an example, although the embodiment of this disclosure will not be limited thereto. Particularly the respective layers can be etched using mixture gas of fluorin-containing gas and chlorin-containing gas in the dry etching process.

In order to further alleviate the thin film transistor formed of the thin film of poly-silicon from being affected by the metal ions of the metal layer diffused into the other area than the channel area, in some embodiments of this disclosure, forming the metal layer can particularly include: forming the patterned metal layer on the one side of the underlying substrate, where a orthographic projection of the pattern of the metal layer onto the underlying substrate overlaps with a orthographic projection of the pattern of the amorphous-silicon layer onto the underlying substrate. In this way, only the metal layer in the area corresponding to the channel area may be reserved so that the metal ions of the metal layer in the area are diffused.

In an implementation, the metal ions diffused out of the metal layer may be accumulated on the surface of the poly-silicon layer on the side thereof away from the buffer layer so that the surface of the poly-silicon layer on the side thereof away from the buffer layer can be processed to remove a part of the poly-silicon layer on the side thereof away from the buffer layer so as to address the problem of large leakage current in the thin film transistor formed of the thin film of poly-silicon. Optionally, in some embodiments of this disclosure, after the amorphous-silicon layer is converted into the poly-silicon layer, the fabricating method can further include: processing the surface of the poly-silicon layer on the side thereof away from the buffer layer to remove a part of the poly-silicon layer on the side thereof away from the buffer layer. Optionally, the surface of the poly-silicon layer on the side thereof away from the buffer layer can be etched in a dry etching process to remove a part of the poly-silicon layer on the side thereof away from the buffer layer. For example, the surface of the poly-silicon layer can be etched using an Inductively Coupled Plasma (ICP) device in a $CF_4$ and $O_2$, or $Cl_2$ and $O_2$ atmosphere at first preset power which is upper electrode source power, and second preset power which is lower electrode bias power. Here optionally the first preset power is high power as needed in the real fabrication method, and in order to avoid a section of the channel area of the poly-silicon layer from being damaged, which would otherwise have affected a characteristic of the formed thin film transistor, the second preset power can be low or zero power.

In order to describe in further details the method for fabricating a thin film of poly-silicon in a thin film transistor according to the embodiment of this disclosure, as illustrated in FIG. 2 to FIG. 9, the method for fabricating a thin film of poly-silicon in a thin film transistor according to the embodiment of this disclosure can include the following steps.

Figure 2:
FIG. 2 is a schematic structural diagram of a barrier layer formed on an underlying substrate according to the embodiment of this disclosure.

The first step is to deposit a 50 nm SiNx layer on an underlying substrate 1 as a barrier layer 2 in a plasma chemical vapor deposition process, where the underlying substrate 1 can be a glass substrate, and the SiNx layer can block alkali metal ions in the glass substrate, e.g., Na or K ions. FIG. 2 illustrates a schematic diagram of the underlying substrate 1 on which the barrier layer 2 is formed.

Figure 3:
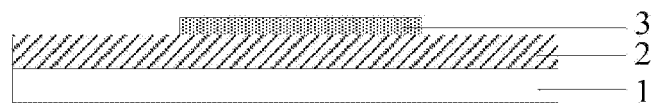
FIG. 3 is a schematic structural diagram of a metal layer formed on the barrier layer according to the embodiment of this disclosure.

The second step is to form a 50 nm patterned Ni metal layer 3 on the barrier layer 2 in a spraying process using the same mask as the pattern of the poly-silicon layer to be formed, where the pattern of the poly-silicon layer to be formed corresponds to a channel area in the thin film transistor. In order to lower the probability that metal atoms diffused out of the Ni metal layer 3 is diffused into another area of the thin film transistor than the channel area, a orthographic projection of the pattern of the Ni metal layer 3 onto the underlying substrate overlaps with a orthographic projection of the pattern of the poly-silicon layer onto the underlying substrate. FIG. 3 illustrates a schematic structural diagram after the Ni metal layer 3 is formed on the barrier layer 2.

Figure 4:
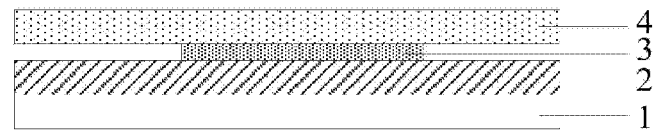
FIG. 4 is a schematic structural diagram of a buffer layer formed on an amorphous-silicon layer according to the embodiment of this disclosure.

The third step is to deposit a 50 nm SiOx thin film on the Ni metal layer 3 as a buffer layer 4 in a plasma chemical vapor deposition process, where the SiOx thin film controls the number of metal ions diffused into the thin film of poly-silicon. FIG. 4 illustrates a schematic diagram after the buffer layer 4 is formed on the Ni metal layer 3.

Figure 5:
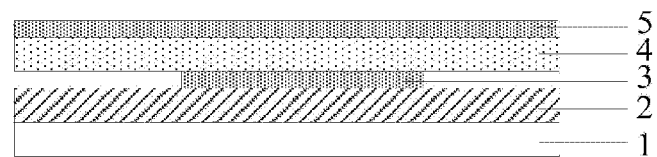
FIG. 5 is a schematic structural diagram of a metal diffusion layer formed on the buffer layer according to the embodiment of this disclosure.

The fourth step is to perform annealing at temperature 500 □ for a first preset length of time so that metal ions of the Ni metal layer 3 is diffused into an upper surface of the SiOx buffer layer 4 to form a metal diffusion layer 5 consisted of the diffused metal ions on the upper surface of the buffer layer 4. FIG. 5 illustrates a schematic diagram after the metal diffusion layer 5 is formed on the buffer layer 4.

Figure 6:
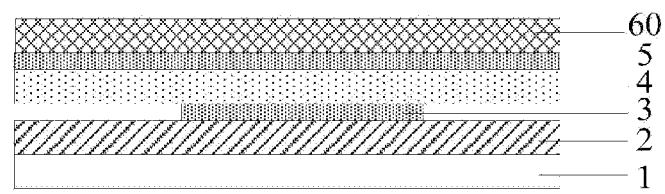
FIG. 6 is a schematic structural diagram of a thin film of amorphous-silicon on the metal diffusion layer according to the embodiment of this disclosure.

The fifth step is to deposit a 50 nm thin film of amorphous-silicon 60 on the metal diffusion layer 5 in a plasma chemical vapor deposition process. FIG. 6 illustrates a schematic diagram after the thin film of amorphous-silicon 60 is formed on the metal diffusion layer 5.

Figure 7:
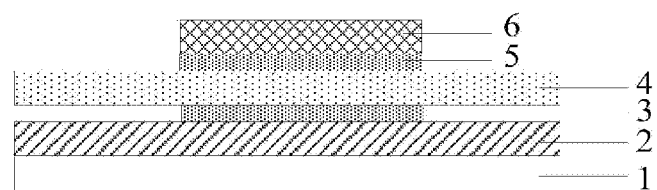
FIG. 7 is a schematic structural diagram of the patterned thin film of amorphous-silicon according to the embodiment of this disclosure.

The sixth step is to form a patterned photo-resist layer (not illustrated) on the thin film of amorphous-silicon 60, and to etch the thin film of amorphous-silicon 60 in an atmosphere of mixture gas of fluorin gas and chlorin gas while being shielded by the patterned photo-resist layer, thus resulting in a patterned amorphous-silicon layer 6, where the patterned amorphous-silicon layer 6 can be crystallized and converted into a poly-silicon layer which is an active layer in the thin film transistor. Furthermore in this step, an over-etching ratio can be defined as appropriate so that the metal diffusion layer 5 in an area corresponding to another area than the channel area is removed while forming the patterned amorphous-silicon layer 6. FIG. 7 illustrates a schematic diagram after the patterned amorphous-silicon layer 6 is formed.

Figure 8:
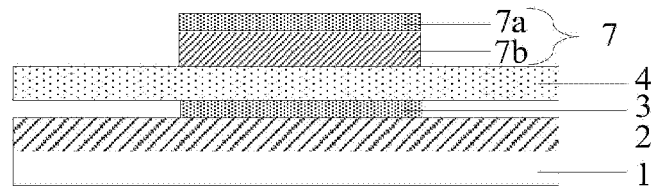
FIG. 8 is a schematic structural diagram of converting the amorphous-silicon layer into a poly-silicon layer according to the embodiment of this disclosure.

The seventh step is to perform annealing at temperature 500 □ for a second preset length of time so that the amorphous-silicon layer 6 is converted into a poly-silicon layer 7 under the catalysis of the metal ions of the metal diffusion layer. In a real fabrication process, the poly-silicon layer 7 may include a first layer 7a including many metal ions on the side thereof away from the buffer layer 4, and a second layer 7b including few metal ions, or no metal ions in an error allowable range. FIG. 8 illustrates a schematic diagram after the amorphous-silicon layer 6 is converted into the thin film of poly-silicon 7.

Figure 9:
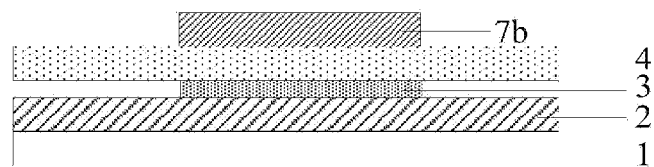
FIG. 9 is a schematic structural diagram after a part of the poly-silicon layer on the side thereof away from the buffer layer is removed according to the embodiment of this disclosure.

The eighth step is to etch the surface of the poly-silicon layer 7 using an ICP device in an atmosphere of mixed gas of $CF_4$ and $O_2$ at first power which is source power, and second preset power which is bias power in a dry etching process to remove a part of the surface of the poly-silicon layer 7 on the side thereof away from the buffer layer 4, i.e., the first layer 7a, while reserving the second layer 7b. FIG. 9 illustrates a schematic diagram after the first layer 7a is removed.

Based upon the same idea of this disclosure, an embodiment of this disclosure further provides a method for fabricating a thin film transistor, where the method includes forming a patterned thin film of poly-silicon on an underlying substrate using the method for fabricating a thin film of poly-silicon in a thin film transistor according to the embodiment of this disclosure. This method for fabricating a thin film transistor addresses the problem under a similar principle to the method above for fabricating a thin film transistor, so reference can be made to the implementation of the method above for fabricating a thin film transistor for an implementation of this method for fabricating a thin film transistor, and a repeated description thereof will be omitted here.

Figure 10:
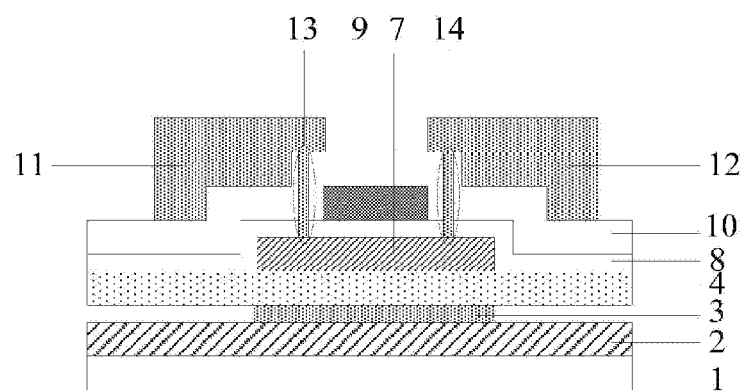
FIG. 10 is a schematic structural diagram of a thin film transistor according to an embodiment of this disclosure.

In an implementation, for the thin film transistor, referring to FIG. 10, the method for fabricating a thin film transistor further includes the steps of fabricating the other layers, and the method for fabricating a thin film transistor can further include the following steps.

The first step is to form a gate insulation layer 8 and a patterned gate 9 on the side of the poly-silicon layer 7 away from the underlying substrate 1 successively, where a orthographic projection of the pattern of the poly-silicon layer 7 onto the underlying substrate covers a orthographic projection of the pattern of the gate 9 onto the underlying substrate.

Optionally, the gate insulation layer 8 is formed on the poly-silicon layer 7, and the gate 9 is formed on the gate insulation layer 8, where the poly-silicon layer 7 here can refer to the poly-silicon layer after a part of the surface thereof on the side thereof away from the buffer layer 4 is removed.

The second step is to form a source-drain insulation layer 10 with a first through-hole 13 and a second through-hole 14 on the side of the gate 9 away from the underlying substrate 1, where the orthographic projection of the pattern of the poly-silicon layer 7 onto the underlying substrate covers orthographic projections of the first through-hole 13 and the second through-hole 14 onto the underlying substrate; and the orthographic projections of the first through-hole 13 and the second through-hole 14 onto the underlying substrate do not overlap with the orthographic projection of the pattern of the gate 9 onto the underlying substrate.

The third step is to form a source 11 and a drain 12 on the side of the source-drain insulation layer 10 away from the underlying substrate 1, where the source 11 is connected in contact with the poly-silicon layer 7 through the first through-hole 13, and the drain 12 is connected in contact with the poly-silicon layer 7 through the second through-hole 14.

Based upon the same idea of this disclosure, an embodiment of this disclosure further provides a thin film of poly-silicon applicable to a thin film transistor, and as illustrated in FIG. 9, the thin film of poly-silicon can include: a metal layer 3 arranged on one side of an underlying substrate 1; a buffer layer 4 arranged on the side of the metal layer 3 away from the underlying substrate 1; and a poly-silicon layer 7 arranged on the side of the buffer layer 4 away from the underlying substrate (the poly-silicon layer 7 can refer to a second layer 7b after a part of the surface thereof on the side thereof away from the buffer layer is removed), where the poly-silicon layer 7 is fabricated using the method above for fabricating a thin film of poly-silicon according to the embodiment of this disclosure. The thin film of poly-silicon addresses the problem under a similar principle to the method above for fabricating a thin film of poly-silicon, so reference can be made to the implementation of the method above for fabricating a thin film of poly-silicon for an implementation of the thin film of poly-silicon, and a repeated description thereof will be omitted here.

Based upon the same idea of this disclosure, an embodiment of this disclosure further provides a thin film transistor, and the thin film transistor addresses the problem under a similar principle to the method above for fabricating a thin film of poly-silicon, so reference can be made to the implementation of the method above for fabricating a thin film of poly-silicon for an implementation of the thin film transistor, and a repeated description thereof will be omitted here.

Optionally, referring to FIG. 10, the thin film transistor according to some embodiments of this disclosure can include: a poly-silicon layer 7 arranged on one side of an underlying substrate, where the poly-silicon layer 7 is a poly-silicon layer according to the embodiment of this disclosure; a gate insulation layer 8 and a patterned gate 9 arranged on the side of the poly-silicon layer 7 away from the underlying substrate 1 successively, where a orthographic projection of the pattern of the poly-silicon layer 7 onto the underlying substrate 1 covers a orthographic projection of the pattern of the gate 9 onto the underlying substrate 1, and furthermore the poly-silicon layer 7 can refer to a second layer 7b after a part of the surface thereof on the side thereof away from the buffer layer (i.e., a first layer 7a) is removed; a source-drain insulation layer 10 arranged on the side of the gate 9 away from the underlying substrate 1, and with a first through-hole 13 and a second through-hole 14, where the orthographic projection of the pattern of the poly-silicon layer 7 onto the underlying substrate 1 covers orthographic projections of the first through-hole 13 and the second through-hole 14 onto the underling substrate, and the orthographic projections of the first through-hole 13 and the second through-hole 14 onto the underling substrate do not overlap with the orthographic projection of the pattern of the gate 9 onto the underlying substrate 1; and a source 11 and a drain 12 arranged on the side of the source-drain insulation layer 10 away from the underlying substrate 1, where the source 11 is connected with the poly-silicon layer 7 through the first through-hole 13, and the drain 12 is connected with the poly-silicon layer 7 through the second through-hole 14.

In summary, in embodiments of this disclosure, after the metal layer, the buffer layer, and the amorphous-silicon layer are formed on the underlying substrate successively, the metal atoms of the metal layer can be diffused and come into contact with the amorphous-silicon layer, and the amorphous-silicon layer can be converted into the poly-silicon layer under the catalysis of the metal atoms. Since the amorphous-silicon layer is converted into the poly-silicon layer using the buffer layer in the fabricated thin film transistor instead of the metal isolation layer in the related art, the metal isolation layer may not be fabricated separately. Since the buffer layer and the metal layer are fabricated before the amorphous-silicon layer is formed, processes of removing the metal layer and the buffer layer can be further dispensed with to thereby lower a production cost and reduce the number of steps in the fabrication process.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for fabricating a thin film of poly-silicon applicable to a thin film transistor, the method comprises:

forming a metal layer on one side of an underlying substrate;

forming a buffer layer on a side of the metal layer away from the underlying substrate;

forming an amorphous-silicon layer on a side of the buffer layer away from the underlying substrate; and converting the amorphous-silicon layer into a poly-silicon layer by catalyzing the amorphous-silicon layer using metal ions which are metal ions diffused from the metal layer, and coming into contact with the amorphous-silicon layer;

wherein after the buffer layer is formed, and before the amorphous-silicon layer is formed on the buffer layer, the method further comprises:

forming a metal diffusion layer on a side of the buffer layer away from the underlying substrate in a first annealing process, wherein the metal diffusion layer is formed by diffusing the metal atoms of the metal layer into the side of the buffer layer away from the underlying substrate.

2. The fabricating method according to claim 1, wherein the converting the amorphous-silicon layer into the poly-silicon layer by catalyzing the amorphous-silicon layer using the metal ions comprises:

converting the amorphous-silicon layer into the poly-silicon layer under a catalysis of the metal diffusion layer in a second annealing process.

3. The fabricating method according to claim 1, wherein the forming the amorphous-silicon layer comprises:

forming a thin film of poly-silicon on a side of the metal diffusion layer away from the underlying substrate; and etching the thin film of poly-silicon in a dry etching process to form a patterned amorphous-silicon layer, and removing the metal diffusion layer in other areas than a first area, wherein a orthographic projection of the first area onto the underlying substrate overlaps with a orthographic projection of the pattern of the amorphous-silicon layer onto the underlying substrate.

4. The fabricating method according to claim 3, wherein the forming the metal layer comprises:

forming a patterned metal layer on the one side of the underlying substrate, where a orthographic projection of the pattern of the metal layer onto the underlying substrate overlaps with a orthographic projection of the pattern of the amorphous-silicon layer onto the underlying substrate.

5. The fabricating method according to claim 1, wherein the converting the amorphous-silicon layer into the poly-silicon layer by catalyzing the amorphous-silicon layer using the metal ions comprises:

diffusing the metal atoms of the metal layer into the amorphous-silicon layer in a third annealing process, and converting the amorphous-silicon layer into the poly-silicon layer under a catalysis of the diffused metal ions.

6. The fabricating method according to claim 1, wherein after the converting the amorphous-silicon layer into the poly-silicon layer, the fabricating method further comprises:

processing a surface of the poly-silicon layer away from the buffer layer, and removing a part of the poly-silicon layer on the surface away from the buffer layer.

7. The fabricating method according to claim 1, wherein before the forming the metal layer, the fabricating method further comprises:

forming a barrier layer on the underlying substrate.

8. A method for fabricating a thin film transistor, the method comprising:

forming a patterned thin film of poly-silicon on an underlying substrate using the method for fabricating a thin film of poly-silicon according to claim 1;

forming a gate insulation layer and a patterned gate on the side of the poly-silicon layer away from the underlying substrate successively, wherein a orthographic projection of the pattern of the poly-silicon layer onto the underlying substrate covers a orthographic projection of the pattern of the gate onto the underlying substrate;

forming a source-drain insulation layer with a first through-hole and a second through-hole on a side of the gate away from the underlying substrate, wherein the orthographic projection of the pattern of the poly-silicon layer onto the underlying substrate covers orthographic projections of the first through-hole and the second through-hole onto the underlying substrate; and the orthographic projections of the first through-hole and the second through-hole onto the underlying substrate do not overlap with the orthographic projection of the pattern of the gate onto the underlying substrate; and forming a source and a drain on a side of the source-drain insulation layer away from the underlying substrate, wherein the source is connected with the poly-silicon layer through the first through-hole, and the drain is connected in contact with the poly-silicon layer through the second through-hole.

9. A thin film of poly-silicon, comprising:

a metal layer arranged on one side of an underlying substrate;

a buffer layer arranged on a side of the metal layer away from the underlying substrate; and a poly-silicon layer arranged a the side of the buffer layer away from the underlying substrate, wherein the poly-silicon layer is fabricated using the method above for fabricating a thin film of poly-silicon according to claim 1.

10. A thin film transistor, comprising:

a thin film of poly-silicon arranged on one side of an underlying substrate, wherein the thin film of poly-silicon is the thin film of poly-silicon according to claim 9;

a gate insulation layer and a patterned gate arranged on a side of the thin film of poly-silicon away from the underlying substrate successively, wherein a orthographic projection of the pattern of the poly-silicon layer onto the underlying substrate covers a orthographic projection of the pattern of the gate onto the underlying substrate;

a source-drain insulation layer arranged on a side of the gate away from the underlying substrate, and with a first through-hole and a second through-hole, wherein the orthographic projection of the pattern of the poly-silicon layer onto the underlying substrate covers orthographic projections of the first through-hole and the second through-hole onto the underling substrate, and the orthographic projections of the first through-hole and the second through-hole onto the underling substrate do not overlap with the orthographic projection of the pattern of the gate onto the underlying substrate; and a source and a drain arranged on the side of the source-drain insulation layer away from the underlying substrate, wherein the source is connected with the poly-silicon layer through the first through-hole, and the drain is connected with the poly-silicon layer through the second through-hole.

11. The thin film of poly-silicon according to claim 9, wherein the poly-silicon layer includes a first layer arranged away from the buffer layer and a second layer arranged between the first layer and the buffer layer; and the first layer includes more metal ions than the second layer.

12. The thin film of poly-silicon according to claim 9, wherein the thin film of poly-silicon further comprises a barrier layer arranged on a side of the underlying substrate facing the metal layer.

13. The thin film of poly-silicon according to claim 12, wherein the underlying substrate is a glass substrate and the barrier layer is a SiNx layer.

14. The thin film of poly-silicon according to claim 9, wherein the metal layer is a patterned Ni metal layer, and an orthographic projection of pattern of the metal layer on the underlying substrate overlaps an orthographic projection of pattern of the poly-silicon layer on the underlying substrate.

15. The thin film of poly-silicon according to claim 9, wherein the buffer layer is a SiOx thin film.

* * * * *